(12) United States Patent
Hench et al.

(10) Patent No.: US 12,379,668 B2
(45) Date of Patent: Aug. 5, 2025

(54) METHODS AND SYSTEMS FOR MEASUREMENT OF SEMICONDUCTOR STRUCTURES WITH MULTI-PASS STATISTICAL OPTIMIZATION

(71) Applicant: KLA Corporation, Milpitas, CA (US)

(72) Inventors: John J. Hench, Los Gatos, CA (US); Daniel J. Haxton, Lake Forest Park, WA (US)

(73) Assignee: KLA Corporation, Milpitas, CA (US)

( * ) Notice: Subject to any disclaimer, the term of this patent is extended or adjusted under 35 U.S.C. 154(b) by 132 days.

(21) Appl. No.: 18/136,764

(22) Filed: Apr. 19, 2023

(65) Prior Publication Data

US 2024/0353760 A1    Oct. 24, 2024

(51) Int. Cl.
*G03F 7/00*       (2006.01)
*G01B 11/24*      (2006.01)

(52) U.S. Cl.
CPC .......... *G03F 7/70625* (2013.01); *G01B 11/24* (2013.01); *G03F 7/705* (2013.01); *G01B 2210/56* (2013.01)

(58) Field of Classification Search
CPC ..... G03F 7/70625; G03F 7/705; G01B 11/24; G01B 2210/56
USPC ........................................................ 356/625
See application file for complete search history.

(56) References Cited

U.S. PATENT DOCUMENTS

| | | | |
|---|---|---|---|
| 5,608,526 A | 3/1997 | Piwonka-Corle et al. | |
| 5,859,424 A | 1/1999 | Norton et al. | |
| 6,023,338 A | 2/2000 | Bareket | |
| 6,429,943 B1 | 8/2002 | Opsal et al. | |
| 6,716,646 B1 | 4/2004 | Wright et al. | |
| 6,778,275 B2 | 8/2004 | Bowes | |
| 6,787,773 B1 | 9/2004 | Lee | |
| 6,992,764 B1 | 1/2006 | Yang et al. | |

(Continued)

FOREIGN PATENT DOCUMENTS

WO    2020-126816 A1    6/2020

OTHER PUBLICATIONS

Lemaillet, Germer, Kline et al., "Intercomparison between optical and x-ray scatterometry measurements of FinFET structures" by Proc. SPIE, v.8681, p. 86810Q (2013).

(Continued)

*Primary Examiner* — Md M Rahman
(74) *Attorney, Agent, or Firm* — Spano Law Group

(57) ABSTRACT

Methods and systems for measuring physical properties of a specimen by iterative solution of an optimization function including both current and prior measurement information are described herein. In one aspect, a Maximum A Posteriori (MAP) estimation approach is employed to integrate prior measurement information with current measurement information in the optimization function. In some examples, prior measurement information associated with the measurement of a semiconductor structure is available from a number of exogenous sources. In a further aspect, prior measurement information includes current measurements of a semiconductor structure under measurement as part of a multiple pass measurement. Prior statistics are determined based on an initial set of values of parameters of interest. The prior statistics are included in a subsequent MAP analysis of the same measurement data set employed in a first measurement pass. In another aspect, prior statistics are tracked to determine their impact on current measurements.

24 Claims, 4 Drawing Sheets

(56) References Cited

U.S. PATENT DOCUMENTS

| | | |
|---|---|---|
| 7,242,477 B2 | 7/2007 | Mieher et al. |
| 7,321,426 B1 | 1/2008 | Poslavsky et al. |
| 7,406,153 B2 | 7/2008 | Berman |
| 7,478,019 B2 | 1/2009 | Zangooie et al. |
| 7,626,702 B2 | 12/2009 | Ausschnitt et al. |
| 7,656,528 B2 | 2/2010 | Abdulhalim et al. |
| 7,826,071 B2 | 11/2010 | Shchegrov et al. |
| 7,842,933 B2 | 11/2010 | Shur et al. |
| 7,873,585 B2 | 1/2011 | Izikson |
| 7,929,667 B1 | 4/2011 | Zhuang et al. |
| 7,933,026 B2 | 4/2011 | Opsal et al. |
| 8,068,662 B2 | 11/2011 | Zhang et al. |
| 8,138,498 B2 | 3/2012 | Ghinovker |
| 9,291,554 B2 | 3/2016 | Kuznetsov et al. |
| 9,826,614 B1 | 11/2017 | Bakeman et al. |
| 9,885,962 B2 | 2/2018 | Veldman et al. |
| 9,915,522 B1 | 3/2018 | Jiang et al. |
| 9,939,250 B2 | 4/2018 | Pisarenco et al. |
| 10,013,518 B2 | 7/2018 | Bakeman et al. |
| 10,101,670 B2 | 10/2018 | Pandev et al. |
| 10,132,763 B2 | 11/2018 | Cramer et al. |
| 10,152,678 B2 | 12/2018 | Pandev et al. |
| 10,324,050 B2 | 6/2019 | Hench et al. |
| 10,345,721 B1 | 7/2019 | Cao et al. |
| 10,352,695 B2 | 7/2019 | Dziura et al. |
| 10,545,104 B2 | 1/2020 | Hench et al. |
| 10,775,323 B2 | 9/2020 | Gellineau et al. |
| 2003/0021465 A1 | 1/2003 | Adel et al. |
| 2007/0176128 A1 | 8/2007 | Van Bilsen et al. |
| 2007/0221842 A1 | 9/2007 | Morokuma et al. |
| 2009/0152463 A1 | 6/2009 | Toyoda et al. |
| 2011/0266440 A1 | 11/2011 | Boughorbel et al. |
| 2012/0292502 A1 | 11/2012 | Langer et al. |
| 2013/0208279 A1 | 8/2013 | Smith |
| 2013/0304424 A1 | 11/2013 | Bakeman et al. |
| 2014/0019097 A1 | 1/2014 | Bakeman et al. |
| 2014/0064445 A1 | 3/2014 | Adler |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2015/0046121 A1 | 2/2015 | Dziura et al. |
| 2015/0110249 A1 | 4/2015 | Bakeman et al. |
| 2015/0117610 A1 | 4/2015 | Veldman et al. |
| 2015/0204664 A1 | 7/2015 | Bringoltz et al. |
| 2015/0285749 A1 | 10/2015 | Moncton et al. |
| 2015/0300965 A1 | 10/2015 | Sezginer et al. |
| 2016/0202193 A1 | 7/2016 | Hench et al. |
| 2016/0320319 A1 | 11/2016 | Hench et al. |
| 2017/0069080 A1 | 3/2017 | Sezginer |
| 2017/0167862 A1 | 6/2017 | Dziura et al. |
| 2018/0106735 A1 | 4/2018 | Gellineau et al. |
| 2018/0113084 A1 | 4/2018 | Hench et al. |
| 2018/0328868 A1 | 11/2018 | Bykanov et al. |
| 2019/0017946 A1 | 1/2019 | Wack et al. |
| 2019/0293578 A1 | 9/2019 | Gellineau |
| 2021/0207956 A1 | 7/2021 | Shchegrov et al. |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).

Mazor, E. et al., "Interacting multiple model methods in target tracking: a survey," IEEE Transactions on Aerospace and Electronic Systems, vol. 34, Issue 1, (Jan. 1998).

International Search Report mailed on Aug. 1, 2024, for PCT Application No. PCT/US2024/022570 filed on Apr. 2, 2024 by KLA Corporation, 3 pages.

METHODS AND SYSTEMS FOR MEASUREMENT OF SEMICONDUCTOR STRUCTURES WITH MULTI-PASS STATISTICAL OPTIMIZATION

TECHNICAL FIELD

The described embodiments relate to measurement systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical and X-ray based metrology techniques offer the potential for high throughput without the risk of sample destruction. A number of metrology based techniques including scatterometry, reflectometry, and ellipsometry implementations and associated analysis algorithms are commonly used to characterize critical dimensions, film thicknesses, composition, overlay and other parameters of nanoscale structures.

Many metrology techniques are indirect methods of measuring physical properties of a specimen under measurement. In most cases, the raw measurement signals cannot be used to directly determine the physical properties of the specimen. Instead, a measurement model is employed to estimate the values of one or more parameters of interest based on the raw measurement signals. For example, ellipsometry is an indirect method of measuring physical properties of the specimen under measurement. In general, a physics-based measurement model or a machine learning based measurement model is required to determine the physical properties of the specimen based on the raw measurement signals (e.g., $\alpha_{meas}$ and $\beta_{meas}$).

In some examples, a physics-based measurement model is created that attempts to predict the raw measurement signals (e.g., $\alpha_{meas}$ and $\beta_{meas}$) based on assumed values of one or more model parameters. As illustrated in equations (1) and (2), the measurement model includes parameters associated with the metrology tool itself, e.g., system parameters ($P_{system}$), and parameters associated with the specimen under measurement. When solving for parameters of interest, some specimen parameters are treated as fixed valued ($P_{spec-fixed}$) and other specimen parameters of interest are floated ($P_{spec-float}$), i.e., resolved based on the raw measurement signals.

$$\alpha_{model} = f(P_{system}, P_{spec-fixed}, P_{spec-float}) \quad (1)$$

$$\beta_{model} = g(P_{system}, P_{spec-fixed}, P_{spec-float}) \quad (2)$$

System parameters are parameters used to characterize the metrology tool (e.g., ellipsometer 101). Exemplary system parameters include angle of incidence (AOI), analyzer angle ($A_0$), polarizer angle ($P_0$), illumination wavelength, numerical aperture (NA), compensator or waveplate (if present), etc. Specimen parameters are parameters used to characterize the specimen (e.g., material and geometric parameters characterizing the structure(s) under measurement). For a thin film specimen, exemplary specimen parameters include refractive index, dielectric function tensor, nominal layer thickness of all layers, layer sequence, etc. For a CD specimen, exemplary specimen parameters include geometric parameter values associated with different layers, refractive indices associated with different layers, etc. For measurement purposes, the system parameters and many of the specimen parameters are treated as known, fixed valued parameters. However, the values of one or more of the specimen parameters are treated as unknown, floating parameters of interest.

In some examples, the values of the floating parameters of interest are resolved by an iterative process (e.g., regression) that produces the best fit between theoretical predictions and experimental data. The values of the unknown, floating parameters of interest are varied and the model output values (e.g., $\alpha_{model}$ and $\beta_{model}$) are calculated and compared to the raw measurement data in an iterative manner until a set of specimen parameter values are determined that results in a sufficiently close match between the model output values and the experimentally measured values (e.g., $\alpha_{meas}$ and $\beta_{meas}$). In some other examples, the floating parameters are resolved by a search through a library of pre-computed solutions to find the closest match.

Scatterometry based metrology often includes indirect methods of measuring physical properties of a specimen under measurement. In these examples, an inverse problem is solved to deduce values of parameters of interest describing a structure based on radiation scattered from a target illuminated by electromagnetic radiation. The scattering information can include reflectivity, transmissivity, polarization states, etc. In many cases, the target includes a periodic structure parameterized by a limited number of parameters of interest.

The inverse problem in metrology is typically solved by casting it as an optimization problem. In many examples, the optimization function optimizes the precision of a parametric estimation given an assumed description of the measurement noise by the maximization of a Likelihood Function, $P(m|x)$, i.e., probability of a measurement, m, given a value of the parameter, x. If posed correctly, the solution may achieve the Cramer-Rao information bounds ensuring the highest precision of the estimate parameter set.

A limitation of the Maximum Likelihood Estimation (MLE) method is that the parameter estimates incorporate no exogenous information about the structure under measurement. The information available at the time of solution of the optimization problem comes from the current measurement, i.e., measurement signals collected from the current measurement and assumed distribution of noise associated with the current measurement. As measurement models become more complex, including higher dimensional parameter vectors, the optimization method begins to break down as the information content becomes insufficient to resolve values of the parameters of interest.

Future metrology applications present challenges for metrology due to increasingly small resolution requirements, multi-parameter correlation, increasingly complex geometric structures, and increasing use of opaque materials. Thus, methods and systems for improved estimation of values of parameters of interest associated with model based measurements are desired.

SUMMARY

Methods and systems for measuring physical properties of a specimen by iterative solution of an optimization function including both current and prior measurement information are described herein. Prior measurement information incorporates additional measurement information such as physical process constraints or wafer-based models to the parameter estimation of a structure under measurement. The additional measurement information enables more stable solutions and higher dimensional parameterization of a structure under measurement. This increases measurement robustness and enables more accurate measurements of complex semiconductor structures.

In one aspect, a Maximum A Posteriori (MAP) estimation approach is employed to integrate prior measurement information with current measurement information in the optimization function employed to drive the recursive, model-based measurement of one or more parameters of interest. An augmented optimization function includes a prior distribution and a Maximum Likelihood Estimation (MLE) function to determine a posterior probability, which is optimized during the model-based measurement.

In a preferred embodiment, the optimization employed to estimate values of one or more parameters of interest is performed via a negated log likelihood function. In these embodiments, the optimization function is the sum of the likelihood function and the prior distribution.

In some examples, prior measurement information associated with the measurement of a semiconductor structure is available from a number of exogenous sources. Prior statistics include one or more statistical measures characterizing the prior measurement information. The prior statistics are included in a MAP analysis of measurement data collected from a plurality of measurement targets on a wafer or set of wafers.

In a further aspect, prior measurement information associated with a current model based measurement of a semiconductor structure includes the current measurements of the semiconductor structure itself as part of a multiple pass measurement of a semiconductor structure of interest.

In a first measurement pass, an initial set of values of an initial set of parameters of interest are determined for a plurality of measurement targets on a wafer or set of wafers. Prior statistics are determined based on the initial set of values of the initial set of parameters of interest. The prior statistics are included in a subsequent MAP analysis of the same measurement data set employed in the first measurement pass.

In some embodiments, statistical measures characterizing prior measurement information include a mean and variance of an assumed distribution of the prior values of the parameters of interest. In some embodiments, the distribution is presumed to be Gaussian.

In further embodiments, additional regularization terms are added to the optimization function, each additional term based on a different statistical measure quantifying prior measurement information. In some of these embodiments, the statistical measures are statistically independent. In some other embodiments, the statistical measures are statistically dependent.

In some embodiments, the prior distribution is not accurately described by a Gaussian distribution. In some of these embodiments, the measure of a parameter is the curvature norm computed as a weighted sum of polynomials or a discrete approximation. In a further aspect, the statistics of a measure of a parameter characterized by a curvature norm are approximated by a bullseye distribution.

Furthermore, the dimensionality of the bullseye distribution is selected such that both the mean and standard deviation of the ensemble of prior measurement data closely match the bullseye distribution.

In some embodiments, measurement system noise is characterized by a Poisson distribution, rather than a Gaussian distribution.

In another aspect, ensemble statistics associated with each statistical measure are determined based on prior measurement information across a wafer, or set of wafers, for each measurement target.

In some embodiments, a spatially constrained model is determined to characterize the ensemble statistics across a wafer, or set of wafers, for each measurement target. In these embodiments, the statistics associated with each measurement target are wafer location dependent.

In some other embodiments, a single aggregate statistical value is determined to characterize the ensemble statistics across a wafer, or set of wafers, for each measurement target. In these embodiments, the statistics associated with each measurement target are independent of wafer location.

In some embodiments, a weighted average of statistics of measurement targets in the neighborhood of a particular measurement target is determined to characterize the ensemble statistics across a wafer, or set of wafers, for each measurement target. In some examples, the weights are functionally related to the distance from the measurement target under measurement.

In another aspect, prior statistics are tracked to determine their impact on current measurements of one or more parameters of interest. In some examples, the statistical tracking measure is updated from wafer to wafer using Markov chains and posterior corrections. In some examples, an Interacting Multiple Model (IMM) or other pseudo-Bayesian technique is employed to track the fabrication process from wafer to wafer.

In a further aspect, prior wafer statistics employed as part of a multiple pass measurement are updated based on the values of the statistical tracking measure. In one example, more recent prior statistics or more spatially proximate statistics are weighed more highly when the statistical tracking measure indicates higher process drift is likely, and vice-versa.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1:
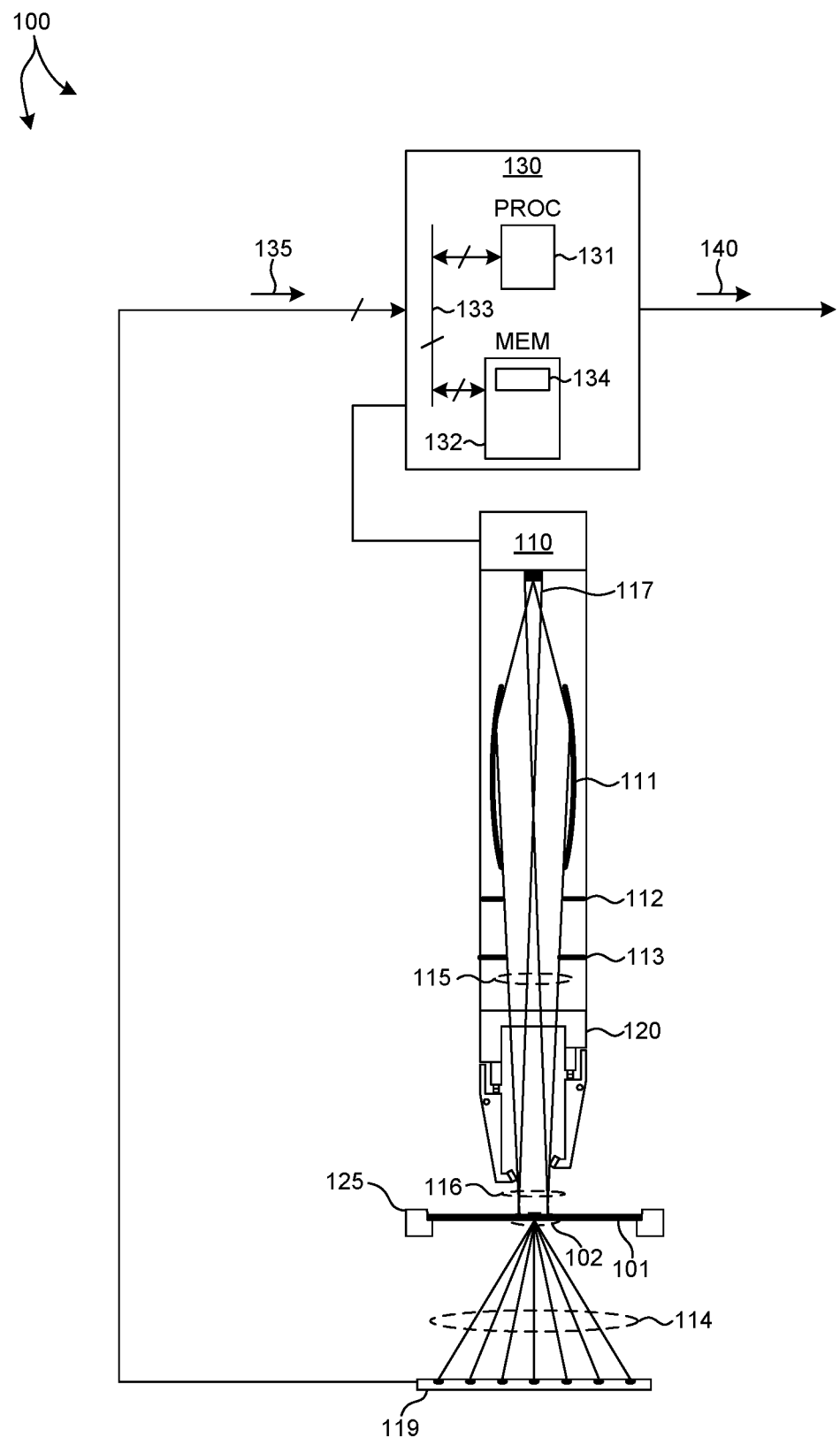
FIG. 1 depicts an illustration of an embodiment of a semiconductor measurement system 100 for estimating values of one or more parameters of interest characterizing structures under measurement in accordance with the exemplary methods presented herein.

Reference will now be made in detail to background examples and some embodiments of the invention, examples of which are illustrated in the accompanying drawings.

Methods and systems for measuring physical properties of a specimen under measurement by iterative solution of an optimization function including both current and prior measurement information are described herein. Rather than relying only on current measurement information to estimate values of parameters of interest associated with a structure under measurement, prior measurement information is also included as part of the optimization function. The prior measurement information incorporates additional measurement information such as physical process constraints or wafer-based models to the parameter estimation of a structure under measurement. The additional measurement information enables more stable solutions and higher dimensional parameterization of a structure under measurement. This increases measurement robustness and enables more accurate measurements of complex semiconductor structures, such as memory structures characterized by a high dimensional parameterization.

In one aspect, statistical measures based on prior measurement information are included as part of an optimization function associated with a current measurement of one or more semiconductor structures.

A Maximum A Posteriori (MAP) estimation approach is employed to integrate prior measurement information with current measurement information in the optimization function employed to drive the recursive, model-based measurement of one or more parameters of interest. The MAP estimation approach employs an augmented optimization function that includes a prior distribution, P(x). P(x) statistically quantifies the prior measurement information, e.g., prior knowledge, associated with the set of one or more parameters of interest, x. The MAP estimator integrates the Maximum Likelihood Estimation (MLE) function, P(m|x), with the prior distribution, P(x), via Bayes theorem as illustrated by Equation (3), where P(x|m) is the probability of a value of each of the set of parameters, x, given the measurement values, m.

$$P(x|m) = P(m|x)P(x) \quad (3)$$

As illustrated by Equation (3), the likelihood function, P(m|x), is multiplied by the prior distribution, P(x), to determine a posterior probability, P(x|m), which is optimized during the model-based measurement. In a preferred embodiment, the optimization employed to estimate values of one or more parameters of interest is performed via a negated log likelihood function. In these embodiments, the optimization function is the sum of the likelihood function, P(m|x), and the prior distribution, P(x), as the logarithm of a product is a sum. Thus, the prior distribution, P(x), is an additional term in the optimization function that regularizes the optimization by constraining the distribution of the set of measured parameters, x.

In some examples, prior measurement information associated with a current measurement of a semiconductor structure is available from a number of exogenous sources, including, but not limited to: historical reference data, physics based model simulations, e.g., etch or lithographic simulations, measurements performed using a different metrology technique, reference measurements from different wafers performed by trusted metrology systems, e.g., SEM, TEM, AFM, etc., modeless measurements, user knowledge, etc.

In these examples, prior statistics are determined based on prior measurement information from one or more exogenous sources. Prior statistics include one or more statistical measures characterizing a prior set of values associated with each of an initial set of parameters of interest. The prior statistics are included in a MAP analysis of measurement data collected from a plurality of measurement targets on a wafer or set of wafers. A MAP based optimization is employed to estimate values of one or more parameters of interest via a negated and shifted log likelihood function. The optimization function is the sum of the likelihood function and the prior statistics. Thus, the prior statistics are included as regularizing terms in the MAP based optimization.

However, determining prior statistics for a MAP estimation based on exogenous sources alone may limit the robustness and precision of the measurement. For example, as a fabrication process drifts, exogenous measurements may not accurately reflect the shape or state of the structure under measurement.

In a further aspect, a multiple pass measurement of a semiconductor structure model involves updating the optimization function of a model based measurement of a semiconductor structure based on values of one or more parameters of interest characterizing the semiconductor structure determined by a prior measurement pass. Each pass of a multiple pass measurement involves a regression on the same set of measurement signals, but with an updated optimization function. In these embodiments, the values of one or more parameters of interest characterizing the semiconductor structure determined by a prior measurement pass are utilized as prior measurement information in an updated optimization function employed to estimate values of the parameters of interest in a subsequent measurement pass. In this manner, the prior statistics employed in a MAP estimation are updated based on current measurement signals, and thus more accurately reflect the shape or state of the structure under measurement.

In some embodiments, an initial set of values of an initial set of parameters of interest are determined for a plurality of measurement targets on a wafer or set of wafers in a first measurement pass. In some embodiments, the initial set of parameters of interest is the same set of parameters of interest to be measured in a final measurement pass. In some other embodiments, the initial set of parameters of interest is a subset of the set of parameters of interest to be measured in a final measurement pass. In some embodiments, the initial set of values of the initial set of parameters of interest is determined by a traditional MLE analysis employed to solve the inverse problem.

Prior statistics are determined based on the initial set of values of the initial set of parameters of interest. The prior statistics are included in a subsequent MAP analysis of the same measurement data set employed in the first measurement pass. In a preferred embodiment, the MAP based optimization employed to estimate values of one or more parameters of interest is performed via a negated and shifted log likelihood function. The optimization function is the sum of the likelihood function and the prior statistics. Thus, the prior statistics are included as regularizing terms in a subsequent measurement pass. In a subsequent measurement pass, a subsequent set of values of a subsequent set of parameters of interest are determined for the plurality of measurement targets measured in the first pass. In some embodiments, the subsequent set of parameters of interest is the same set of parameters of interest to be measured in a final measurement pass.

In preferred embodiments, two measurement passes are employed to estimate the final set of values of the final set of parameters of interest. However, in general, any number of measurement passes may be contemplated within the scope of this patent document. At each measurement pass, the prior statistics are updated for the subsequent measurement pass based on the statistical measures determined from the estimated set of values of the set of parameters of interest determined from the previous measurement pass. In some embodiments, the prior statistics are based entirely on the estimated set of values of the set of parameters of interest determined from the previous measurement pass. However, in some other embodiments, the prior statistics are based on a combination of statistics derived from prior measurement passes and exogenous measurements as described hereinbefore. In some of these embodiments, the combination of prior statistics is implemented as a weighted sum of prior statistics terms in the current optimization function.

Each successive measurement pass may have a different number of parameters. In some embodiments, it may be preferable to perform an MLE optimization with a lower dimensional parameterization. This is acceptable because not all parameters need to be regularized in a subsequent MAP optimization. Furthermore, because the MAP optimization is regularized, it may generate acceptable results for larger dimensional parameterizations or for measurement situations where the parameterization of the structure under measurement does not account for particular physical characteristics, e.g., aperiodicity.

FIG. 1 illustrates a system 100 for measuring characteristics of a specimen and estimating values of one or more parameters of interest associated with each measurement in accordance with the exemplary methods presented herein. FIG. 1 illustrates an embodiment of a Transmission, Small Angle X-ray Scatterometry (T-SAXS) metrology tool 100 used to perform T-SAXS measurements over an inspection area 102 of a specimen 101 illuminated by an illumination beam spot.

In the depicted embodiment, metrology tool 100 includes an x-ray illumination source 110 configured to generate x-ray radiation suitable for T-SAXS measurements. In general, any suitable high-brightness x-ray illumination source capable of generating high brightness x-rays at flux levels sufficient to enable high-throughput, inline metrology may be contemplated to supply x-ray illumination for T-SAXS measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 110. In one example, an inverse Compton source available from Lyncean Technologies, Inc., Palo Alto, California (USA) may be contemplated. Inverse Compton sources have an additional advantage of being able to produce x-rays over a range of photon energies, thereby enabling the x-ray source to deliver x-ray radiation at different, selectable wavelengths.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 110 produces x-ray emission over a source area having finite lateral dimensions (i.e., non-zero dimensions orthogonal to the beam axis. Focusing optics 111 focuses source radiation onto a metrology target located on specimen 101. The finite lateral source dimension results in finite spot size 102 on the target defined by the rays 117 coming from the edges of the source. In some embodiments, focusing optics 111 includes elliptically shaped focusing optical elements.

A beam divergence control slit 112 is located in the beam path between focusing optics 111 and beam shaping slit mechanism 120. Beam divergence control slit 112 limits the divergence of the illumination provided to the specimen under measurement. In some embodiments, an additional intermediate slit 113 is located in the beam path between beam divergence control slit 112 and beam shaping slit mechanism 120. Intermediate slit 113 provides additional beam shaping. Beam shaping slit mechanism 120 is located in the beam path immediately before specimen 101. The slits of beam shaping slit mechanism 120 are located in close proximity to specimen 101 to minimize the enlargement of the incident beam spot size due to beam divergence defined by finite source size. In one example, expansion of the beam spot size due to shadow created by finite source size is approximately one micrometer for a 10 micrometer x-ray source size and a distance of 25 millimeters between the beam shaping slits and specimen 101. In other examples, beam divergence is controlled by beam shaping slits located less than 100 millimeters from specimen 101.

In some embodiments, beam shaping slit mechanism 120 includes multiple, independently actuated beam shaping slits. In one embodiment, beam shaping slit mechanism 120 includes four independently actuated beam shaping slits. These four beams shaping slits effectively block a portion of incoming beam 115 and generate an illumination beam 116 having a box shaped illumination cross-section.

In general, x-ray optics shape and direct x-ray radiation to specimen 101. In some examples, the x-ray optics include an x-ray monochromator to monochromatize the x-ray beam that is incident on the specimen 101. In some examples, the x-ray optics collimate or focus the x-ray beam onto measurement area 102 of specimen 101 to less than 1 milliradian divergence using multilayer x-ray optics. In these examples, the multilayer x-ray optics function as a beam monochromator, also. In some embodiments, the x-ray optics include one or more x-ray collimating mirrors, x-ray apertures, x-ray beam stops, refractive x-ray optics, diffractive optics such as zone plates, Montel optics, specular x-ray optics such as grazing incidence ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

X-ray detector 119 collects x-ray radiation 114 scattered from specimen 101 and generates output signals 135 indicative of properties of specimen 101 that are sensitive to the incident x-ray radiation in accordance with a T-SAXS measurement modality. In some embodiments, scattered x-rays 114 are collected by x-ray detector 119 while specimen positioning system 125 locates and orients specimen 101 to produce angularly resolved scattered x-rays.

In some embodiments, a T-SAXS system includes one or more photon counting detectors with high dynamic range (e.g., greater than $10^5$). In some embodiments, a single photon counting detector detects the position and number of detected photons.

In some embodiments, a T-SAXS system is employed to determine properties of a specimen (e.g., structural parameter values) based on one or more diffraction orders of scattered light. As depicted in FIG. 1, metrology tool 100 includes a computing system 130 employed to acquire signals 135 generated by detector 119 and determine properties of the specimen based at least in part on the acquired signals.

In some examples, metrology based on T-SAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

In one aspect, computing system 130 is configured as a multiple pass measurement engine configured to determine the values of one or more parameters of interest characterizing a measured structure based on an amount of measurement data collected by a measurement system, e.g., metrology system 100, and prior measurement information.

Figure 2:
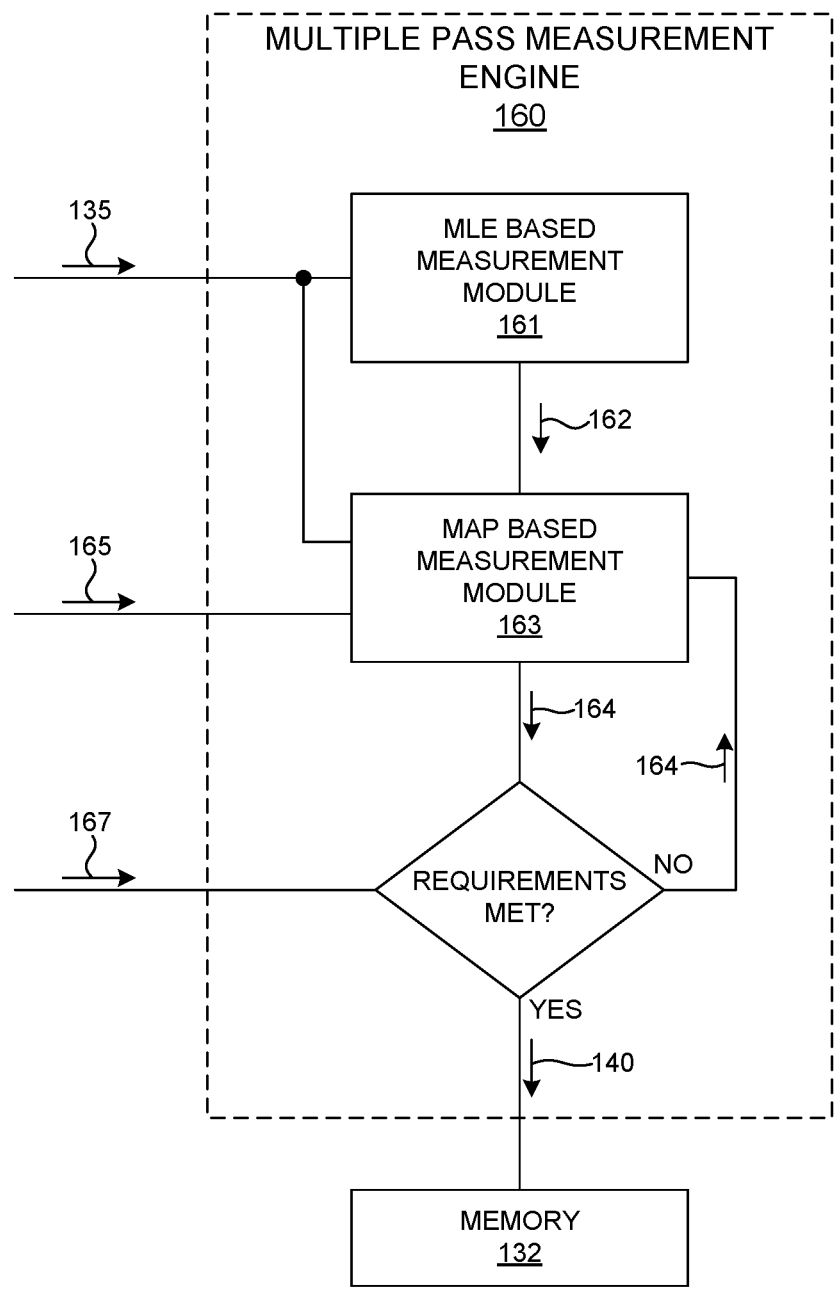
FIG. 2 is a diagram illustrative of an exemplary multiple pass measurement engine 160 in one embodiment.

FIG. 2 depicts an illustration of a multiple pass measurement engine 160 in one embodiment. As depicted in FIG. 2, multiple pass measurement engine 160 includes a MLE based measurement module 161 and a MAP based measurement module 163.

As depicted in FIG. 2, measurement data 135 collected from one or more structures under measurement, e.g., by metrology system 100 depicted in FIG. 1, is communicated to MLE based measurement module 161. MLE based measurement module 161 determines an initial set of values of an initial set of parameters of interest characterizing the measured structures based on the measurement data 135. MLE based measurement module 161 employs regression on a measurement model to optimize a likelihood function. The initial values 162 of the initial set of parameters of interest are communicated to MAP based measurement module 163.

As depicted in FIG. 2, measurement data 135 collected from one or more structures under measurement, the initial values 162 of the initial set of parameters of interest, and optionally, prior statistics 165 generated from exogenous sources are received by MAP based measurement module 163. Statistical measures characterizing each of the initial set of values of the initial set of parameters of interest, and any prior statistics 165 from exogenous sources are included as part of the optimization function driving the MAP based analysis. Prior statistics for exogenous sources often encompass two sources of uncertainty: the statistical spread in the measurement ensemble and the inherent measurement error of the exogenous measurement. In general, both sources of uncertainty are combined in a single prior statistical model. MAP based measurement module 163 employs regression on a measurement model to optimize an objective function including a likelihood function and additional terms including the statistical measures characterizing each of the initial set of values of the initial set of parameters of interest and any prior statistics 165. In some embodiments, the estimated values 164 of one or more parameters of interest are stored in a memory, e.g., memory 132, as the final estimated values 140 of the parameters of interest.

In some other embodiments, the estimated values 164 are evaluated to determine whether measurement requirements 167, e.g., desired measurement uncertainty, etc., have been met. If so, the estimated values of the parameters of interest are stored in a memory, e.g., memory 132. If not, the estimated values of the parameters of interest are communicated back to MAP based measurement module 163, and a subsequent iteration of the MAP based analysis is performed. In the subsequent iteration the objective function includes the likelihood function and additional terms including the statistical measures characterizing each of the estimated values of the parameters of interest determined in the prior iteration. The iteration continues until the desired measurement requirements are met. The final estimated values 140 of one or more parameters of interest are stored in a memory, e.g., memory 132.

In general, prior measurement information is characterized by one or more statistical measures, i.e., prior statistics, and these statistical measures are implemented in a MAP based optimization function.

Prior measurement information includes actual measurement data, simulated measurement data, assumed measurement data, or any combination thereof. In some embodiments, prior measurement information includes simulated measurement data from the simulation of a measurement of one or more measurement targets that are structurally different from the structures under measurement.

In some embodiments, prior measurement information includes actual measurement data from the measurement of particular targets by a particular measurement tool. Typically, the measurement data includes actual measurements of targets on nominal wafers. In some embodiments, measurement data is collected from multiple wafers. In some embodiments, measurement data is collected from Design Of Experiments (DOE) wafers. In some embodiments, measurement data is collected by multiple measurement systems.

In some embodiments, prior measurement information includes assumed values of one or more parameters of interest. In one example, the values of one or more parameters of interest are assumed to fall within an expected range. A statistical measure is imposed on the one or more parameters based on the assumed range without an underlying ensemble of simulated or measured data. In one example, it is expected that a parameter, x, varies in a range [A B]. A Gaussian regularization is presumed where the mean, m, and the standard deviation, S, are computed to match the first two moments for an assumed uniform distribution as illustrated by Equations (4) and (5).

$$m = \frac{1}{2}(B + A) \quad (4)$$

$$S = \frac{1}{12}(B - A)^2 \quad (5)$$

In the multidimensional case, a diagonal matrix, S, has diagonal elements associated with each range, inducing a regularizing cost function term, C, illustrated by Equation (6).

$$C = \frac{1}{2}(m - x)^T S^{-1}(m - x) \quad (6)$$

In some examples, a regularizing cost function term derived from assumed statistics is added as an additional independent cost function term associated with a subset of parameters where no statistics are available. In some other examples, a regularizing cost function term derived from assumed statistics is added as an additional independent cost function term associated with all parameters in addition to cost function terms derived from available statistics.

In some embodiments, the statistical measures include a mean and variance of an assumed distribution of the prior values of parameters of interest, e.g., prior assumed values, prior simulated values, or prior measured values of the parameters of interest.

In some embodiments, both the likelihood function, $P(m|x)$, and the prior distribution, $P(x)$, are presumed to be Gaussian, parameterized by a mean and variance as illustrated by Equations (7a) and (7b), where, x, is the parameter vector, $s(x)$ is the function that produces a signal from the parameterization, S is the variance of the signal, i.e., $E[ss^T]$, $m_s$ is the mean of the signal, $m_x$ is the mean of the parameter and T is the variance of the parameter, i.e., $E[xx^T]$.

$$P(m|x) = \det(2\pi S)^{-\frac{1}{2}} \exp\left(-\frac{1}{2}(s(x) - m_s)^T S^{-1}(s(x) - m_s)\right) \quad (7a)$$

$$P(x) = \det(2\pi T)^{-\frac{1}{2}} \exp\left(-\frac{1}{2}(x - m_x)^T T^{-1}(x - m_x)\right) \quad (7b)$$

The objective function, $C'(p)$, illustrated by Equation (8) is realized by taking the logarithm of the functions $P(m|x)$ and $P(x)$, changing signs to yield a minimum, and removing constants to produce a minimum at zero, $$C'(p) = \frac{1}{2}(m_s - s(x))^T S^{-1}(m_s - s(x)) + \frac{1}{2}(m_x - x)^T T^{-1}(m_x - x) \quad (8)$$

In further embodiments, additional regularization terms are added to the optimization function, each additional term based on a different statistical measure quantifying prior measurement information.

In some of these embodiments, the statistical measures, $f_i$, are statistically independent. In these embodiments, the joint probability associated with the set of statistical measures can be calculated by simply multiplying the probabilities associated with each independent event. Furthermore, the log-likelihood associated with joint probability associated with the set of statistical measures is calculated as the sum of the probabilities associated with each independent event. In one example, a cost function, $c''^{(p)}$, includes two independent statistical measures, $f_1(x)$ and $f_2(x)$, characterizing prior measurement information. $C''^{(p)}$ is illustrated by Equation (9), where mi is the mean of measure $f_1(x)$ and $V_1$ is its variance. The form of Equation (9) assumes a Gaussian distribution associated with the statistical measures, $f_1$ and $f_2$.

$$C''^{(p)} = \quad (9)$$
$$C(p) + \frac{1}{2}(m_1 - f_1(x))^T V_1^{-1}(m_1 - f_1(x)) + \frac{1}{2}(m_2 - f_2(x))^T V_2^{-1}(m_2 - f_2(x))$$

The cost function illustrated by Equation (9) includes additional regularization terms associated with two additional, independent statistical measures, $f_1$ and $f_2$. However, in general, a cost function may include additional regularization terms associated with any number of independent statistical measures of prior measurement information.

In some other embodiments, the statistical measures, $f_i$, are statistically dependent. In these embodiments, the joint probability associated with the set of statistical measures includes additional terms to address the covariance between the measures.

In general, a cost function may include additional regularization terms associated with any number of statistical measures of prior measurement information without requiring that the measures be statistically independent or dependent with known correlations. In these examples, a cost function includes additional regularization terms associated with any number of statistical measures of prior measurement information without consideration of the statistical relationship among the statistical measures to simplify the optimization and reduce computational effort.

In some embodiments, the statistical measures characterizing prior measurement information include a mean and variance of an assumed distribution of normed values across sets of prior values of a number of parameters of interest. The normed values are strictly positive and arise from an integral norm of any form. The distribution of the underlying parameters of interest is assumed to be Gaussian. In general, the class of transformations of a multi-dimensional Gaussian distribution to its reduced statistic on the induced radius from its mean is referred to as a bullseye distribution. Hence, the distribution of the normed values is assumed to be a bullseye distribution having a probability density function illustrated by Equation (10). The Bullseye function has dimensionality, n, and is defined by the measure, r.

$$p(r) = c \frac{r^n}{\sigma^{n+1}} e^{-\frac{r^2}{2\sigma^2}} \quad (10)$$

In some of these embodiments, the normed measure, r, is the integral of curvature over a profile, x, as illustrated by Equation (11).

$$r^2 = \int_0^1 \left(\frac{d^2 y}{dx^2}\right)^2 dx \quad (11)$$

In some embodiments, the integral is computed exactly if the function y(x) is described as a weighted sum of polynomials, or a discrete approximation, e.g., when y is known at a discrete number of points. A cost function term, $C'''$, associated with normed values is illustrated by Equation (12).

$$C'''(r) = \frac{1}{2}\left(\frac{r}{\sigma}\right)^2 - \frac{k}{2}\ln\left(\frac{r}{\sigma}\right)^2 + \ln\sigma \quad (12)$$

The probability density function of the Bullseye distribution is parameterized by one parameter, $\sigma$, which scales as the mean. However, variance is accommodated by changing dimensionality, n. In this manner, the Bullseye distribution is fit to the mean and variance of the ensemble by selecting n and $\sigma$ to fit the ensemble data. A moment generating function illustrated by Equation (13) is employed to fit the Bullseye distribution to the ensemble data, where, $\mu$, is the mean of the ensemble data and, V, is the variance of the ensemble data.

$$M_{m,n}(r) = \pi^{(1-n)/2} 2^{(n+m-1)/2} \sigma^m \Gamma(n+m+1) \quad (13)$$

$$\mu = \frac{M_{1,n}}{M_{0,n}}$$

$$V = \frac{M_{2,n}}{M_{0,n}} - \left(\frac{M_{1,n}}{M_{0,n}}\right)^2$$

In some examples, the values of $\sigma$ and n are adjusted to match the mean and variance of the normed data using a two dimensional search algorithm.

In another aspect, ensemble statistics associated with each statistical measure, $f_i(x)$, are determined based on prior measurement information collected at different locations across a wafer or set of wafers for each measurement target.

In some embodiments, a single aggregate statistical value is determined to characterize the ensemble statistics across a wafer or set of wafers for each measurement target. In these embodiments, the statistics associated with each measurement target are independent of wafer location. In these embodiments, the mean, v, of an ensemble of reference data, d, including N data points is computed as illustrated by Equation (14).

$$v = \frac{1}{N}\sum_{i=1}^{N} d_i \quad (14)$$

In some embodiments, a spatially parameterized model is determined to characterize the ensemble statistics associated with prior measurement information collected at different locations across a wafer or set of wafers for each measurement target. Prior statistics employed in a MAP based optimization are subsequently computed from the spatially parameterized model.

In these embodiments, the statistics associated with each measurement target are wafer location dependent.

In some embodiments, a spatially parameterized model for the mean, $v(\rho,\theta)$, is fit to the reference data, d, using a least-squared fit, where $\rho$ and $\theta$ are polar coordinates specifying location on a wafer surface. The variance is determined by subtracting the mean from the reference data and squaring the result as illustrated by Equation (15).

$$\bar{V} = \frac{1}{N}\sum_{i=1}^{N} (d_i - v(\rho, \theta))(d_i - v(\rho, \theta))^T \quad (15)$$

For normed data, the variance is adapted to examples where the mean values are fit to a spatially varying curve. In these examples, the variance is computed after the model for the mean is fit, where, $\bar{r}(\rho)$, is the fit of the mean as illustrated by Equation (16).

$$\bar{V} = \frac{1}{N}\sum_{i=1}^{N} (r_i - \bar{r}(\rho))(r_i - \bar{r}(\rho))^T \quad (16)$$

In some embodiments, the dimensionality, n, of a Bullseye distribution is adjusted to match the mean values from the fit and the variance as illustrated by Equation (16). The functional form of the mean is scaled by the square root of the dimensionality to obtain the Bullseye parameter, $\sigma$, as illustrated by Equation (17).

$$\bar{\sigma}(\rho, \theta) = \bar{r}(\rho, \theta)/\sqrt{n} \quad (17)$$

In some embodiments, a weighted average of statistics of measurement targets in the neighborhood of a particular measurement target is determined to characterize the ensemble statistics across a wafer or set of wafers for each measurement target. In some examples, the weights are functionally related to the distance from the measurement target under measurement, e.g., the mathematical process of Kriging. In these embodiments, the statistics associated with each measurement target are wafer location dependent, height dependent, or both.

In some embodiments, measurement system noise is more accurately characterized by a Poisson distribution, rather than a Gaussian distribution. In these embodiments, the likelihood function, $P(m|x)$, is characterized by a Poisson distribution illustrated by Equation (18).

$$P(m|x) = \prod_{i=1}^{N} \frac{e^{-s_i(x)} s_i(x)^{m_i}}{m_i!} \quad (18)$$

Taking the negative logarithm of the function described by Equation (18), changing signs, and setting offsets to produce a minimum at zero, yields the cost function, $C_{poisson}$, illustrated by Equation (19).

$$C_{poisson}(x) = \sum_{i=1}^{N} (s_i(x) - m_i) - (m_i \ln s_i(x) - m_i \ln m_i) \quad (19)$$

In another aspect, prior statistics are tracked to determine their impact on current measurements of one or more parameters of interest. In some embodiments, a statistical tracking measure is determined that characterizes the probability of rapid process drift. When a fabrication process is tracking normally, the statistical tracking measure has a low probability, and when the fabrication process is undergoes an unexpected excursion, the statistical tracking measure has a high probability. In this manner, the statistical tracking measure tracks prior and posterior statistics of wafers over time.

In some examples, the statistical tracking measure is updated from wafer to wafer using Markov chains and posterior corrections. In some examples, an Interacting Multiple Model (IMM) or other pseudo-Bayesian technique is employed to track the fabrication process from wafer to wafer. In some examples, the statistics may be determined over the entire wafer. In some other examples, the statistics may be determined within a number of different regions of the wafers. In these examples, a probability map over the wafer is determined that shows the probability of rapid process drift associated with each of the different regions of the wafers.

In a further aspect, prior wafer statistics employed as part of a multiple pass measurement are updated based on the values of the statistical tracking measure. In one example, more recent prior statistics or more spatially proximate statistics are weighed more highly when the statistical tracking measure indicates higher process drift is likely, and vice-versa.

Additional information regarding Interacting Multiple Models is described by E. Mazor et al., "Interacting multiple model methods in target tracking: a survey," IEEE Transactions on Aerospace and Electronic Systems, Volume 34, Issue 1, (January 1998), the content of which is incorporated herein by reference in its entirety.

Figure 3:
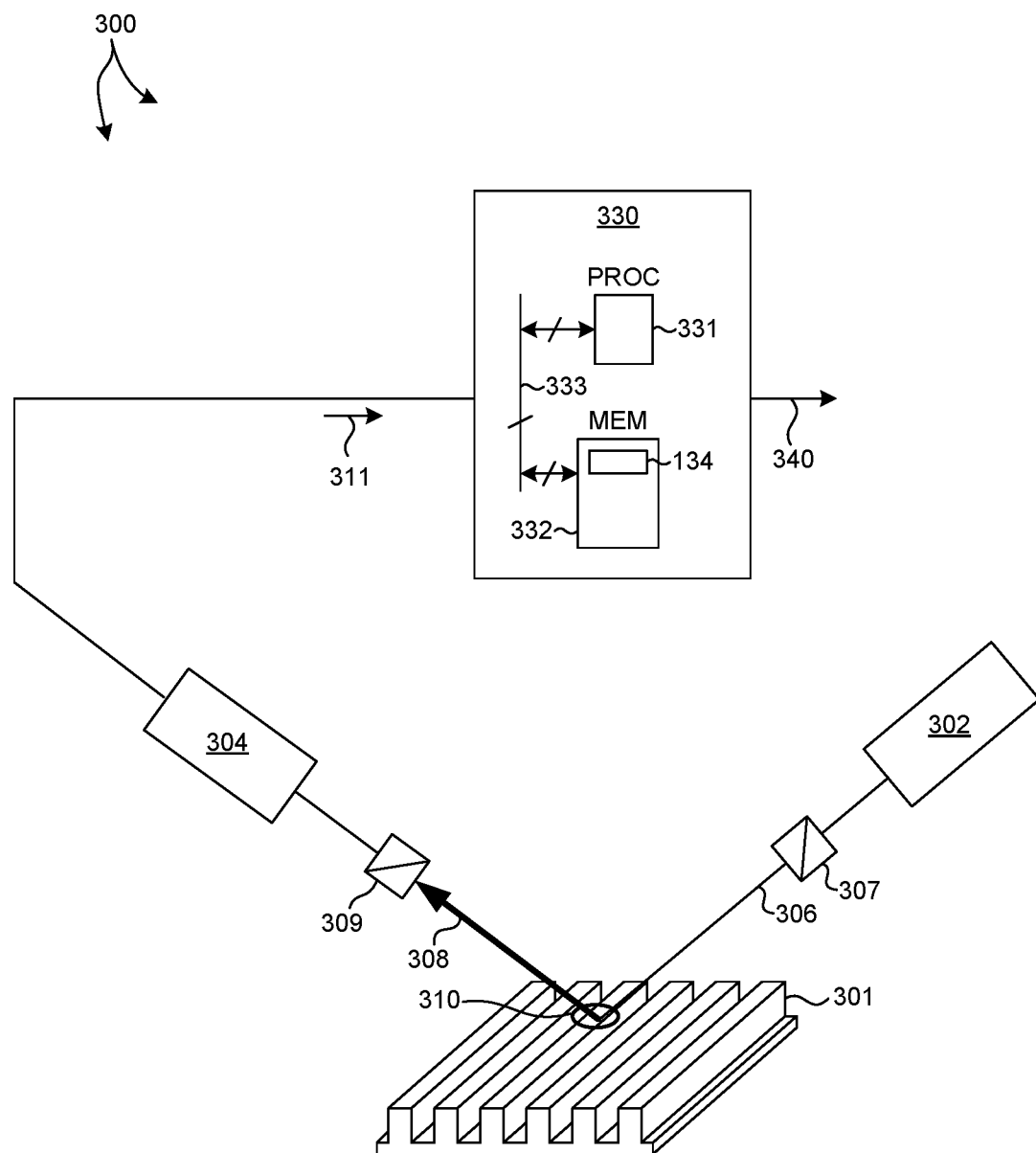
FIG. 3 depicts an illustration of another embodiment of a semiconductor measurement system 300 for estimating values of one or more parameters of interest characterizing structures under measurement in accordance with the exemplary methods presented herein.

By way of non-limiting example, FIG. 3 illustrates a system 300 for measuring characteristics of a specimen in accordance with the exemplary methods presented herein. As shown in FIG. 3, the system 300 may be used to perform spectroscopic ellipsometry measurements of structure 301. In this aspect, the system 300 may include a spectroscopic ellipsometer equipped with an illuminator 302 and a spectrometer 304. The illuminator 302 of the system 300 is configured to generate and direct illumination of a selected wavelength range (e.g., 100-2500 nm) to the structure disposed on the surface of the specimen upon which structure 301 is fabricated. In turn, the spectrometer 304 is configured to receive illumination reflected from structure 301. It is further noted that the light emerging from the illuminator 302 is polarized using a polarization state generator 307 to produce a polarized illumination beam 306. The radiation reflected by structure 301 is passed through a polarization state analyzer 309 and to the spectrometer 304. The radiation received by the spectrometer 304 in the collection beam 308 is analyzed with regard to polarization state, allowing for spectral analysis by the spectrometer of radiation passed by the analyzer. These spectra 311 are passed to the computing system 330 for analysis of the structure as described herein.

As depicted in FIG. 3, system 300 includes a single measurement technology (i.e., SE). However, in general, system 300 may include any number of different measurement technologies. By way of non-limiting example, system 300 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, a single tool integrating multiple technologies, or a combination thereof.

In a further embodiment, system 300 may include one or more computing systems 330 employed to estimate values of one or more parameters of interest 340 characterizing measured structures in accordance with the methods described herein. The one or more computing systems 330 may be communicatively coupled to the spectrometer 304. In one aspect, the one or more computing systems 330 are configured to receive measurement data 311 associated with measurements of a structure under measurement (e.g., structure 301).

In some embodiments, the measurement model is employed to estimate values of geometric parameters of interest (e.g., critical dimensions, overlay, etc.), dispersion parameters of interest (e.g., index of refraction, etc.), process parameters of interest (e.g., lithographic focus, dosage, etc.), electrical properties of interest (e.g., bandgap, etc.), or any combination thereof.

In a further aspect, values of parameters of interest are determined for measurements of production wafers, monitor wafers, or both, on one measurement tool, or across multiple measurement tools.

In general, measurement data may be collected from any suitable semiconductor measurement system. Suitable systems, by way of non-limiting example, include a spectroscopic ellipsometer, a spectroscopic reflectometer, a soft x-ray based metrology system, a small angle x-ray scatterometry system, an imaging system, a hyperspectral imaging system, etc.

In some embodiments, the structures under measurement as described herein may be actual device structures or dedicated metrology targets.

In general, the measurement data may be collected from one or more targets by multiple, different metrology systems. In one example, measurement data from a first target may be collected by a spectroscopic ellipsometer, measurement data from the same target, or a different target may be collected by a small-angle x-ray scatterometry (SAXS) system, and measurement data from the same target or a different target may be collected by an imaging based metrology system.

In yet another further aspect, the measurement results described herein may be used to provide active feedback to the process tool (e.g., lithography tool, etch tool, deposition tool, etc.). For example, values of measured parameters determined based on measurement methods described herein may be communicated to an etch tool to adjust the etch time to achieve a desired etch depth. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values may be communicated to the process tool. In one embodiment, computing system 130 determines values of one or more parameters of interest. In addition, computing system 130 communicates control commands to a process controller based on the determined values of the one or more parameters of interest. The control commands cause the process controller to change the state of the process (e.g., stop the etch process, change the diffusivity, etc.). In one example, a control command causes a process controller to adjust the focus of a lithographic system, a dosage of the lithographic system, or both. In another example, a control command causes a process controller to change the etch rate to improve measured wafer uniformity of a CD parameter.

In some examples, the measurement models are implemented as an element of a SpectraShape® optical critical-dimension metrology system available from KLA-Tencor Corporation, Milpitas, California, USA. In this manner, the model is created and ready for use immediately after the spectra are collected by the system.

In some other examples, the measurement models are implemented off-line, for example, by a computing system implementing AcuShape® software available from KLA-Tencor Corporation, Milpitas, California, USA. The resulting, trained model may be incorporated as an element of an AcuShape® library that is accessible by a metrology system performing measurements.

Figure 4:
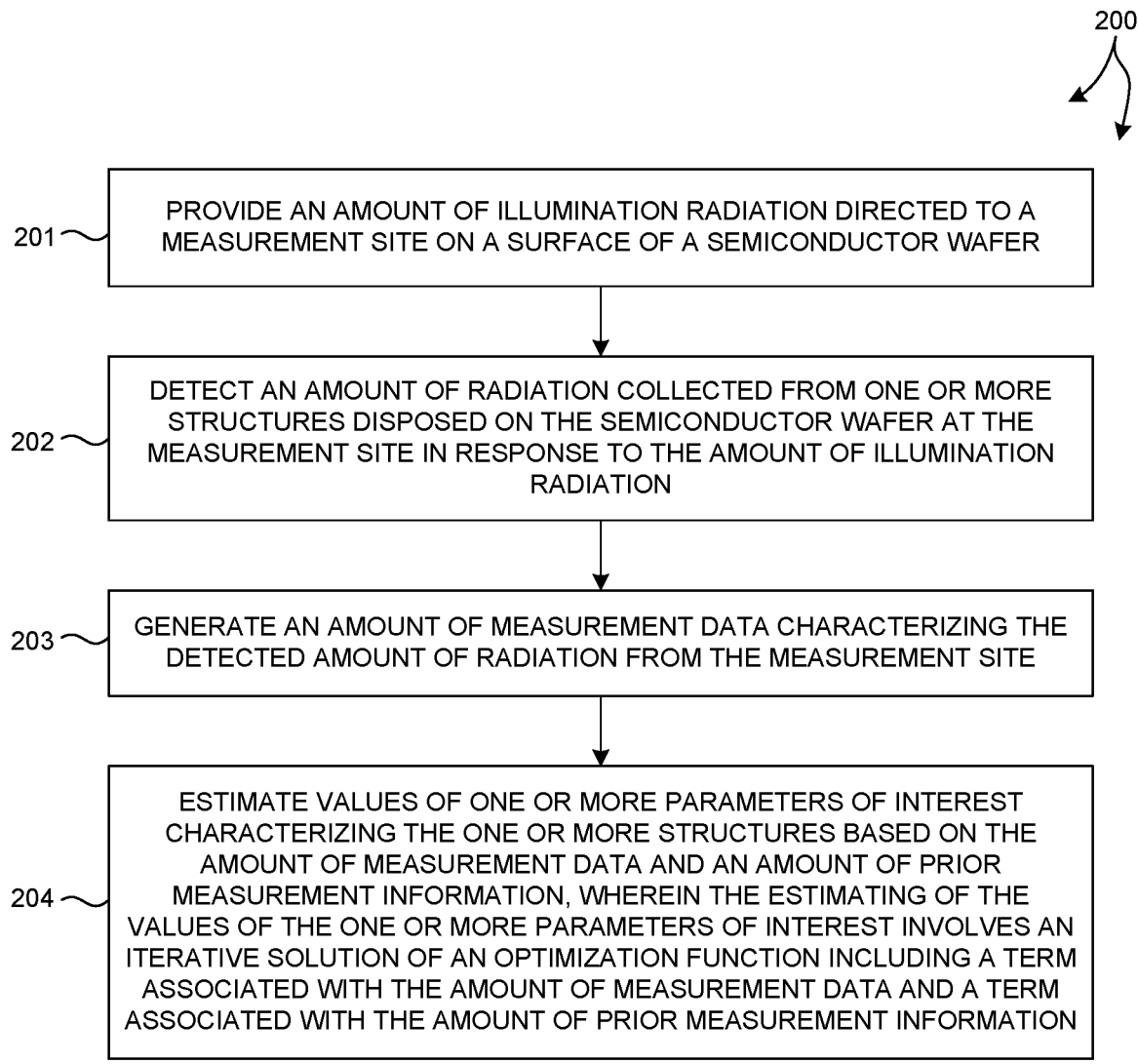
FIG. 4 illustrates a flowchart of a method 200 for estimating values of one or more parameters of interest characterizing structures under measurement in accordance with the exemplary methods presented herein.

FIG. 4 illustrates a method 200 for estimating a value of a quality metric indicative of one or more performance characteristics of a semiconductor measurement in at least one novel aspect. Method 200 is suitable for implementation by a metrology system such as metrology system 100 illustrated in FIG. 1 of the present invention. In one aspect, it is recognized that data processing blocks of method 200 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 201, an amount of illumination radiation is provided and directed to a measurement site on a surface of a semiconductor wafer.

In block 202, an amount of radiation collected from one or more structures disposed on the semiconductor wafer at the measurement site is detected in response to the amount of illumination radiation.

In block 203, an amount of measurement data characterizing the detected amount of radiation from the measurement site is generated.

In block 204, values of one or more parameters of interest characterizing the one or more structures are estimated based on the amount of measurement data and an amount of prior measurement information. The estimating of the values of the one or more parameters of interest involves an iterative solution of an optimization function including a term associated with the amount of measurement data and a term associated with the amount of prior measurement information.

In a further embodiment, system 100 includes one or more computing systems 130 employed to perform measurements of semiconductor structures in accordance with the methods described herein. The one or more computing systems 130 may be communicatively coupled to one or more spectrometers, active optical elements, process controllers, illumination sources, etc. In one aspect, the one or more computing systems are configured to receive measurement data associated with measurements of one or more structures disposed on a wafer.

It should be recognized that one or more steps described throughout the present disclosure may be carried out by a single computer system 130 or, alternatively, a multiple computer system 130. Moreover, different subsystems of system 100 may include a computer system suitable for carrying out at least a portion of the steps described herein. Therefore, the aforementioned description should not be interpreted as a limitation on the present invention but merely an illustration.

In addition, the computer system 130 may be communicatively coupled to the detectors in any manner known in the art. For example, the one or more computing systems 130 may be coupled to computing systems associated with the detector. In another example, the detector may be controlled directly by a single computer system coupled to computer system 130.

The computer system 130 of system 100 may be configured to receive and/or acquire data or information from the subsystems of the system (e.g., detectors and the like) by a transmission medium that may include wireline and/or wireless portions. In this manner, the transmission medium may serve as a data link between the computer system 130 and other subsystems of system 100.

Computer system 130 of system 100 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board system 100, external memory, or other external systems). For example, the computing system 130 may be configured to receive measurement data from a storage medium (i.e., memory 132 or an external memory) via a data link. For instance, measurement results obtained using the detectors described herein may be stored in a permanent or semi-permanent memory device (e.g., memory 132 or an external memory). In this regard, the measurement results may be imported from on-board memory or from an external memory system. Moreover, the computer system 130 may send data to other systems via a transmission medium. For instance, a measurement model or an estimated parameter value determined by computer system 130 may be communicated and stored in an external memory. In this regard, measurement results may be exported to another system.

Computing system 130 may include, but is not limited to, a personal computer system, cloud-based computing system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A system comprising:
   an illumination source configured to provide an amount of illumination radiation directed to a measurement site on a surface of a semiconductor wafer;
   a detector configured to detect an amount of radiation collected from one or more structures disposed on the semiconductor wafer at the measurement site in response to the amount of illumination radiation; and
   a computing system configured to:
   generate an amount of measurement data characterizing the detected amount of radiation from the measurement site; and
   estimate values of one or more parameters of interest characterizing the one or more structures based on the amount of measurement data and an amount of prior measurement information, wherein the estimating of the values of the one or more parameters of interest involves a first iterative solution of an optimization function including a first term associated with the amount of measurement data and a term associated with the amount of prior measurement information.

2. The system of claim 1, the computing system further configured to:
   estimate prior values of at least one of the one or more parameters of interest characterizing the one or more structures based on the amount of measurement data, wherein the estimating of the prior values of at least one of the one or more parameters of interest involves second iterative solution of a prior optimization function including a second term associated with the amount of measurement data, and wherein the amount of prior measurement information includes the prior values of at the least one of the one or more parameters of interest.

3. The system of claim 2, wherein the iterative solution of the optimization function is based on a Maximum A Posteriori (MAP) analysis, and the iterative solution of the prior optimization function is based on a Maximum Likelihood Estimation (MLE) analysis.

4. The system of claim 3, wherein the optimization function is a negated log likelihood function, wherein the first term associated with the amount of measurement data is a likelihood function, and wherein the term associated the amount of prior measurement information includes a positive function characterized by a statistical model of the amount of prior measurement information.

5. The system of claim 4, wherein the statistical model of the amount of prior measurement information is parameterized by wafer location.

6. The system of claim 4, wherein the statistical model of the amount of prior measurement information characterizes a statistical spread in a measurement ensemble of the amount of prior measurement information and a measurement error of an exogenous measurement employed to measure the amount of prior measurement information.

7. The system of claim 1, wherein the first term associated with the amount of measurement data includes a statistical model of measurement noise, and wherein the statistical model assumes a Gaussian distribution of the measurement noise.

8. The system of claim 1, wherein the term associated with the amount of prior measurement information includes a positive function characterized by a statistical model of the amount of prior measurement information, wherein the statistical model assumes a Gaussian distribution of prior values of at the least one of the one or more parameters of interest.

9. The system of claim 1, wherein the first term associated with the amount of measurement data includes a statistical model of measurement noise, and wherein the statistical model assumes a Poisson distribution of the measurement noise.

10. The system of claim 1, wherein the term associated with the amount of prior measurement information includes a positive function characterized by a statistical model of the amount of prior measurement information, wherein the statistical model assumes a generalized bullseye distribution of normed values, wherein the normed values are determined from prior values of at least two parameters of interest.

11. The system of claim 10, the computing system further configured to:
determine a value of a dimensionality of the generalized bullseye distribution such that the statistical model best matches a mean and standard deviation of an ensemble of normed values.

12. The system of claim 1, wherein the amount of prior measurement information incorporated in the optimization function is derived from one or more of exogenous sources.

13. The system of claim 1, the computing system further configured to:
track values of one or more statistical measures characterizing prior wafer statistics characterizing the amount of prior measurement information; and
update the prior measurement information based on the values of the one or more statistical measures.

14. The system of claim 1, wherein the illumination source and the detector comprise an optical metrology system or an X-Ray based metrology system.

15. The system of claim 1, wherein the amount of prior measurement information includes assumed values of the one or more parameters of interest, wherein the assumed values are within an expected range of values of the one or more parameters of interest, and wherein the assumed values are characterized by an assumed statistical distribution.

16. A method comprising:
providing an amount of illumination radiation directed to a measurement site on a surface of a semiconductor wafer;
detecting an amount of radiation collected from one or more structures disposed on the semiconductor wafer at the measurement site in response to the amount of illumination radiation;
generating an amount of measurement data characterizing the detected amount of radiation from the measurement site; and
estimating values of one or more parameters of interest characterizing the one or more structures based on the amount of measurement data and an amount of prior measurement information, wherein the estimating of the values of the one or more parameters of interest involves a first iterative solution of an optimization function including a first term associated with the amount of measurement data and a term associated with the amount of prior measurement information.

17. The method of claim 16, further comprising:
estimating prior values of at least one of the one or more parameters of interest characterizing the one or more structures based on the amount of measurement data, wherein the estimating of the prior values of at least one of the one or more parameters of interest involves an second iterative solution of a prior optimization function including a second term associated with the amount of measurement data, and wherein the amount of prior measurement information includes the prior values of at the least one of the one or more parameters of interest.

18. The method of claim 16, wherein the optimization function is a negated log likelihood function, wherein the first term associated with the amount of measurement data is a likelihood function, and wherein the term associated the amount of prior measurement information includes a positive function characterized by a statistical model of the amount of prior measurement information.

19. The method of claim 18, wherein the statistical model is parameterized by wafer location.

20. The method of claim 16, wherein the first term associated with the amount of measurement data includes a statistical model of measurement noise, and wherein the statistical model assumes a Poisson distribution of the measurement noise.

21. The method of claim 16, wherein the term associated with the amount of prior measurement information includes a positive function characterized by a statistical model of the amount of prior measurement information, wherein the statistical model assumes a generalized bullseye distribution of normed values, wherein the normed values are determined from prior values of at least two parameters of interest.

22. The method of claim 16, further comprising:
tracking values of one or more statistical measures characterizing prior wafer statistics characterizing the amount of prior measurement information; and
updating the prior measurement information based on the values of the one or more statistical measures.

23. A system comprising:
an illumination source configured to provide an amount of illumination radiation directed to a measurement site on a surface of a semiconductor wafer;
a detector configured to detect an amount of radiation collected from one or more structures disposed on the semiconductor wafer at the measurement site in response to the amount of illumination radiation; and
a non-transient, computer-readable medium storing instructions that, when executed by one or more processors, causes the one or more processors to:

generate an amount of measurement data characterizing the detected amount of radiation from the measurement site; and estimate values of one or more parameters of interest characterizing the one or more structures based on the amount of measurement data and an amount of prior measurement information, wherein the estimating of the values of the one or more parameters of interest involves a first iterative solution of an optimization function including a first term associated with the amount of measurement data and a term associated with the amount of prior measurement information.

24. The system of claim 23, the non-transient, computer-readable medium further storing instructions that, when executed by the one or more processors, causes the one or more processors to:

estimate prior values of at least one of the one or more parameters of interest characterizing the one or more structures based on the amount of measurement data, wherein the estimating of the prior values of at least one of the one or more parameters of interest involves an second iterative solution of a prior optimization function including a second term associated with the amount of measurement data, and wherein the amount of prior measurement information includes the prior values of at the least one of the one or more parameters of interest.

* * * * *